United States Patent [19]
Suhir

[11] Patent Number: 6,028,772
[45] Date of Patent: Feb. 22, 2000

[54] ELECTRONIC ASSEMBLY HAVING IMPROVED RESISTANCE TO DELAMINATION

[75] Inventor: Ephraim Suhir, Randolph, N.J.

[73] Assignee: Lucent Technologies Inc., Murray Hill, N.J.

[21] Appl. No.: 09/133,606

[22] Filed: Aug. 13, 1998

[51] Int. Cl.[7] .................................................... H05K 7/20
[52] U.S. Cl. ........................ 361/708; 165/80.2; 174/16.3
[58] Field of Search ................... 165/80.2, 80.3, 165/185; 174/252, 16.3; 257/686, 706–707, 712, 726, 727, 777, 786; 361/704–711, 719, 720, 735, 744, 790

[56] References Cited

U.S. PATENT DOCUMENTS

| | | | |
|---|---|---|---|
| 4,920,574 | 4/1990 | Yamamoto et al. | 361/705 |
| 5,019,943 | 5/1991 | Fassbender et al. | 361/704 |
| 5,745,344 | 4/1998 | Baslta et al. | 361/705 |

OTHER PUBLICATIONS

E. Suhir, Stresses in Bi–Metal Thermostats, Sep. 1986, *Journal of Applied Mechanics*, vol. 108.

*Primary Examiner*—Gregory Thompson

[57] ABSTRACT

An electronic assembly having a first component, a second component, and a layer of adhesive bonding the first and second components together, one or both of the first and second components includes thinned or tapered peripheral edges. The layer of adhesive includes a thickened portion which is adjacent to the thinned or tapered peripheral edges, the thickened portion having a thickness which is greater than the thickness of the remaining portion of the layer.

9 Claims, 1 Drawing Sheet ative features of the invention will appear more fully upon consideration of the illustrative embodiments now to be described in detail in connection with the accompanying drawings wherein:

ELECTRONIC ASSEMBLY HAVING IMPROVED RESISTANCE TO DELAMINATION

FIELD OF THE INVENTION

This invention relates to electronic assemblies, and in particular, to an electronic assembly comprising first and second components, one or both of which are rounded or beveled at their peripheral edges, bonded together by a layer of adhesive thickened at the rounded or beveled peripheral edges to improve resistance to delamination.

BACKGROUND OF THE INVENTION

Electronic assemblies are used in a vast assortment of equipment including computers and communication systems. An electronic assembly typically comprises two or more components bonded together in a laminate structure with a layer of adhesive or solder material. The components of the assembly commonly include a circuit board and a heat sink. The layer of adhesive is usually of a thermally conductive material. Heat generated by various circuit components mounted on the circuit board is drawn away from the board by the heat sink.

The components of the assembly typically have different coefficients of thermal expansion (contraction). This undesirably causes thermally induced interfacial shearing and peeling stresses when the assembly is heated and cooled. These stresses are greatest at the perimeter of the assembly. Consequently, delamination often occurs at the perimeter typically leading to reduced performance or failure. Therefore, electronic assemblies having improved resistance to delamination are needed.

SUMMARY

An electronic assembly comprises a first component, a second component, and a layer of adhesive bonding the first and second components together. At least one of the components has thinned or tapered peripheral edges. The layer of adhesive is thickened adjacent the thinned or tapered peripheral edges to improve the assembly's resistance to delamination.

BRIEF DESCRIPTION OF THE DRAWINGS

The advantages nature and various additional features of the invention will appear more fully upon consideration of the illustrative embodiments now to be described in detail in connection with the accompanying drawings wherein.

It is to be understood that these drawings are for purposes of illustrating the concepts of the invention and, except for graphical illustrations, are not to scale.

DETAILED DESCRIPTION OF THE INVENTION

Figure 1:
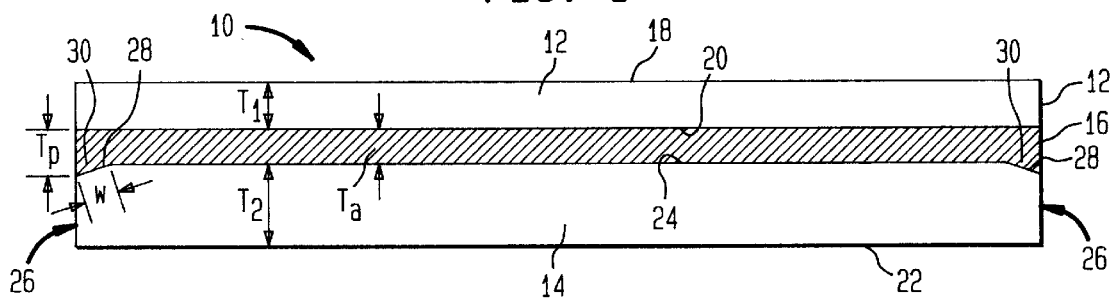
FIG. 1 is a sectional view of an electronic assembly according to an embodiment of the present invention.

FIG. 1 shows an electronic assembly 10 according to an embodiment of the present invention. The assembly 10 comprises a substantially rigid first component 12 bonded to a substantially rigid second component 14. The first component 12 can comprise a printed circuit board (PCB) or semiconductor chip and the second component 14 can comprse a heat sink or a substrate. The first component 12 includes opposing outer and inner planar surfaces 18, 20 and has a thickness $t_1$. The second component 14 includes opposing outer and inner planar surfaces 22, 24 and has a thickness $t_2$.

The inner surface 20 of the first component 12 is bonded to the inner surface 24 of the second component 14 with a layer of adhesive 16. In the case where the components are a PCB and a heat sink the layer of adhesive 16 can comprise a thermally conductive adhesive material or a solder material.

At least one of the first and second components 12, 14 includes thinned or tapered peripheral edges 26 (FIG. 1 shows this on the second component 14) which allow an increased amount of adhesive to be deposited adjacent the entire perimeter of the assembly 10. The thinned or tapered peripheral edges 26 can be provided by rounding, beveling, or relieving the inner surface 24 at the edges of the component. This respectively produces rounded, beveled or relieved inner surface portions 28 (beveled inner surface portions are shown) each having a width W which is equal to about $1-2*t_1$ (when $t_1<t_2$) or $1-2*t_2$ (when $t_2<t_1$). In other words, width W is approximate slightly greater than the thickness of the thinner one of the first and second components 12, 14. For example, if the first component 12 has a thickness $t_1$ of about 1 mm and the second component 14 has a thickness $t_2$ of about 5 mm, then the width W of the inner surface portion 28 will be about 1–2 mm.

When the components 12, 14 are of the same thickness, the width W is approximately equal to or slightly greater than the thickness of either one of the first and second components 12, 14. Thus, if the first component 12 has a thickness $t_1$ of about 1 mm and the second component 14 has a thickness $t_2$ of about 1 mm then the width W of the inner surface portion 28 will be about 1–2 mm.

The rounded, beveled, or relieved inner surface portions 28 allow a thickened perimeter portion 30 of the layer of adhesive 16 to be formed adjacent the perimeter of the assembly 10. The thickened perimeter portion 30 has a maximum thickness $t_p$ which is greater than the thickness $t_a$ of the remaining portion of the layer 16 bounded by the perimeter portion 30. For example, $t_a$ of the remaining bounded portion of the adhesive layer 16 can be about 2 mils and the thickened perimeter portion 30 can have a maximum thickness $t_p$ of about 5 mils. The thickened perimeter portion 30 reduces shearing and peeling stresses concentrated along the perimeter of the assembly 10. This in turn, advantageously improves the delamination resistance of the assembly 10. Because shearing and peeling stresses just within the perimeter of the assembly 10 are very low, the thickness of the layer of adhesive 16 in this portion does not have to be increased. This advantageously allows the overall thickness of the assembly 10 to remain unchanged.

The effect of the increased thickness of the adhesive layer on the interfacial stresses in the assembly 10 can be better understood by considering the following analysis. The analysis is carried out in application to the maximum shearing stress. The maximum shearing stress at the edge of the assembly 10 can be evaluated as:

$$T_{max} = kT \tan h\, kl \tag{1}$$

where T is the thermally induced force in the components of an infinitely large assembly (can be assumed independent of the thickness of the adhesive layer, unless the components are made of thermally matched materials), l is half the length of the assembly, and $$k = \sqrt{\lambda/\kappa} \quad (2)$$

is the parameter of the interfacial compliance. See, E. Suhir, "*Stresses in Bi-Metal Thermostats,*" JOURNAL OF APPLIED MECHANICS, Vol. 108 (1986). In formula (2), $\lambda=\lambda_1+\lambda_2$ is the axial compliance of the assembly (which is due, in the case of thin and/or low modulus adhesives, to the materials and geometry of the components only, and is therefore independent of the thickness of the adhesive layer) and $\kappa$ is the interfacial compliance. In the case of sufficiently compliant adhesive layers (which is typically the case), $\kappa$ is due to the compliance of the adhesive layer only, and is expressed as $$\kappa = \frac{2(1+v)}{3E}h \quad (3)$$

(where $v$ is Poisson's ratio and $E$ is Young's modulus) in the case of long-and-stiff assemblies (h/l<0.2), and as $$\kappa = \frac{(1+v)(3-v)}{\pi E}l \quad (4)$$

in the case of short-and-compliant assemblies (h/l>1.0).
In the more typical case of long-and-stiff assemblies, we have $$\tau_{max} \cong kT = T\sqrt{\frac{\lambda}{\kappa}} = T\sqrt{\frac{3E\lambda}{2(1+v)h}} \quad (5)$$

Thus, the maximum shearing stress is inversely proportional to the square root of the adhesive thickness:

$$\tau_{max} \sim \frac{1}{\sqrt{h}} \quad (6)$$

Formula (6) indicates that the maximum value of the interfacial shearing stress can be reduced by increasing the thickness of the adhesive layer, thereby enabling it to provide a better buffering effect. Because the interfacial stresses are concentrated at the perimeter of the assembly, the thickness of the adhesive layer only along the perimeter of the assembly is increased. The stress reductions provided by the increasing the thickness of the adhesive layer at the perimeter of the assembly, become quite significant for very thin (typically less than 1 mil) adhesive layers.

Figure 2:
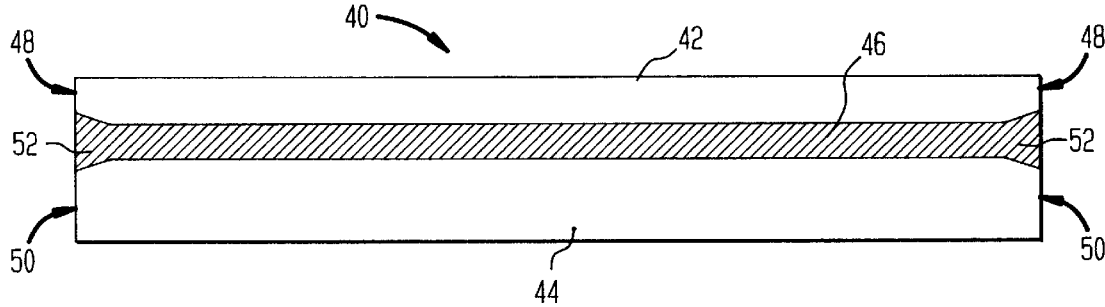
FIG. 2 is a sectional view of an electronic assembly according to a second embodiment of the present invention.

FIG. 2 shows an electronic assembly 40 according to a second embodiment of the present invention. The electronic assembly 40 is similar to the assembly shown in FIG. 1 in that it comprises first and second components 42, 44 bonded together by a layer of adhesive 46. However, each component 42, 44 of the assembly 40 is provided with thinned or tapered peripheral edges 48, 50. This permits the layer of adhesive 46 to be provided with a thickened perimeter portion 52 which is about twice as thick as a similar assembly having thinned or tapered peripheral edges on only one of the components.

While the foregoing invention has been described with reference to the above embodiments, various modifications and changes may be made without departing from the spirit of the present invention. For example, other adhesively bonded or soldered assemblies such as those used in photonics or fiber optics, can benefit from thie teachings of the present invention. Accordingly, modifications and changes such as those suggested above but not limited thereto are considered to be within the scope of the claims.

What is claimed is:

1. An electronic assembly comprising:
   a first component comprising a printed circuit board;
   a second component; and
   a layer of adhesive bonding the first and second components together;
   at least one of the first and second components having peripheral edges which are thinner than the remainder of the component, the layer of adhesive having a thickened portion adjacent the thinned peripheral edges, the thickened portion having a thickness which is greater than the thickness of the remaining portion of the layer.

2. The electronic assembly according to claim 1, wherein the other one of the first and second components comprises a heat sink.

3. The electronic assembly according to claim 2, wherein the heat sink includes the thinned peripheral edges.

4. The electronic assembly according to claim 2, wherein the printed circuit board includes the thinned peripheral edges.

5. The electronic assembly according to claim 1, wherein the thinned peripheral edges are tapered.

6. The electronic assembly according to claim 5, wherein the thinned peripheral edges include rounded surfaces.

7. The electronic assembly according to claim 5, wherein the thinned peripheral edges include beveled surfaces.

8. The electronic assembly according to claim 1, wherein the thinned peripheral edges include relieved surfaces.

9. The electronic assembly according to claim 1, wherein both the first and second components have thinned peripheral edges.

\* \* \* \* \*